United States Patent
Higgins

(10) Patent No.: US 7,375,948 B2
(45) Date of Patent: May 20, 2008

(54) VARIABLE CHARGE PACKET INTEGRATED CIRCUIT CAPACITOR

(75) Inventor: John A. Higgins, Westlake Village, CA (US)

(73) Assignee: Teledyne Licensing, LLC, Thousand Oaks, CA (US)

(*) Notice: Subject to any disclaimer, the term of this patent is extended or adjusted under 35 U.S.C. 154(b) by 204 days.

(21) Appl. No.: 11/452,000

(22) Filed: Jun. 12, 2006

(65) Prior Publication Data

US 2007/0285873 A1    Dec. 13, 2007

(51) Int. Cl.
*H01G 4/228* (2006.01)

(52) U.S. Cl. .............. 361/306.2; 361/306.1; 361/306.3; 361/311; 361/321.1; 361/277; 438/238; 438/239

(58) Field of Classification Search ............ 361/361.2, 361/306.1, 306.3, 302–305, 311–313, 277, 361/278, 281, 328, 763, 764
See application file for complete search history.

(56) References Cited

U.S. PATENT DOCUMENTS

| | | | | |
|---|---|---|---|---|
| 5,636,099 A | * | 6/1997 | Sugawara et al. | 361/278 |
| 5,854,097 A | * | 12/1998 | Ohmi et al. | 438/182 |
| 6,285,542 B1 | * | 9/2001 | Kennedy et al. | 361/328 |
| 6,524,923 B2 | * | 2/2003 | Funk et al. | 438/379 |
| 6,674,321 B1 | * | 1/2004 | York | 327/586 |
| 6,900,976 B2 | * | 5/2005 | Hiraoka et al. | 361/277 |
| 7,037,772 B2 | * | 5/2006 | Yeo et al. | 438/210 |
| 7,092,232 B2 | * | 8/2006 | Yamagata et al. | 361/277 |

* cited by examiner

*Primary Examiner*—Nguyen T Ha
(74) *Attorney, Agent, or Firm*—Koppel, Patrick, Heybl & Dawson

(57) ABSTRACT

A variable IC capacitor includes a semiconductor layer doped to contain mobile charge carriers. Capacitor electrodes C1 and C2 are disposed adjacent to each other on the layer's surface, gate electrodes G1 and G2 are disposed on opposite sides of C1 and C2, and source and sink electrodes are disposed on opposite sides of G1 and G2. Potentials are applied to the electrodes as needed to inject and then confine a finite charge into the region under C1 and C2. A drive voltage V applied between C1 and C2 causes the charge packet to move back and forth beneath them, such that the effective capacitance C seen by drive voltage V is given by C=Q/V, where Q is the magnitude of the charge packet.

20 Claims, 5 Drawing Sheets

VARIABLE CHARGE PACKET INTEGRATED CIRCUIT CAPACITOR

BACKGROUND OF THE INVENTION

1. Field of the Invention

This invention relates generally to capacitors, and, more particularly, to integrated circuit capacitors.

2. Description of the Related Art

Capacitors are found in virtually all electronic circuits. Many such circuits require the use of a variable or programmable capacitor, to provide a needed capacitance value in a tunable RF circuit, for example, or to generate a desired waveform.

Circuits of this type are often fabricated as an integrated circuit (IC). When this is the case, the means by which the variable or programmable capacitance is provided are ideally compatible with the processes required to fabricate the IC. There are several known variable IC capacitor types, such as varactors or op amp-boosted Miller capacitances, but these approaches impose limitations on capacitance range and/or maximum capacitance that may be unacceptable.

SUMMARY OF THE INVENTION

The present invention provides a variable capacitor which is wholly compatible with IC processing technologies, and can provide a capacitance which is controllable over several orders of magnitude.

The present IC capacitor employs a mobile charge packet. A semiconductor layer is doped to contain mobile charge carriers of a first polarity. First and second capacitor electrodes are disposed adjacent to each other on a surface of the layer, first and second gate electrodes are disposed on opposite sides of the capacitor electrodes, and source and sink electrodes are disposed on opposite sides of the gate electrodes. Circuitry is coupled to the gate, source and sink electrodes, which applies potentials to the electrodes as needed to:

- inject a finite charge into the region of the layer under the capacitor electrodes, and
- apply potentials to the gate electrodes such that the injected charge is confined to the region of the layer under the capacitor electrodes. The confined charge is referred to herein as a "charge packet". In addition, the circuitry is preferably also arranged to initialize the capacitor by removing all mobile charge carriers from the region of the layer under the capacitor electrodes prior to injecting the finite charge.

With the charge packet confined under the capacitor electrodes, an RF drive signal voltage V applied between the capacitor electrodes causes the charge packet to move back and forth between the portion of the region below the first capacitor electrode and the portion of the region below the second capacitor electrode. The capacitance C seen by the RF drive signal voltage is given by C=Q/V, where Q is the magnitude of the charge packet. The potentials applied to the gate, source and sink electrodes can be manipulated to provide a desired Q value, and thus a desired C value.

The capacitor can be arranged such that the capacitor current $I_{cap}$ varies non-linearly with varying levels of RF drive signal voltage V, due to the use of a finite charge of fixed magnitude. Alternatively, RF drive signal voltage V can be fixed, and the capacitor arranged such that current $I_{cap}$ varies linearly with the magnitude of finite charge Q. A means for detecting the variation of current $I_{cap}$ can be provided and used to control V and/or Q as needed to provide a desired functionality.

These and other features, aspects, and advantages of the present invention will become better understood with reference to the following drawings, description, and claims.

DETAILED DESCRIPTION OF THE INVENTION

Figure 1A:
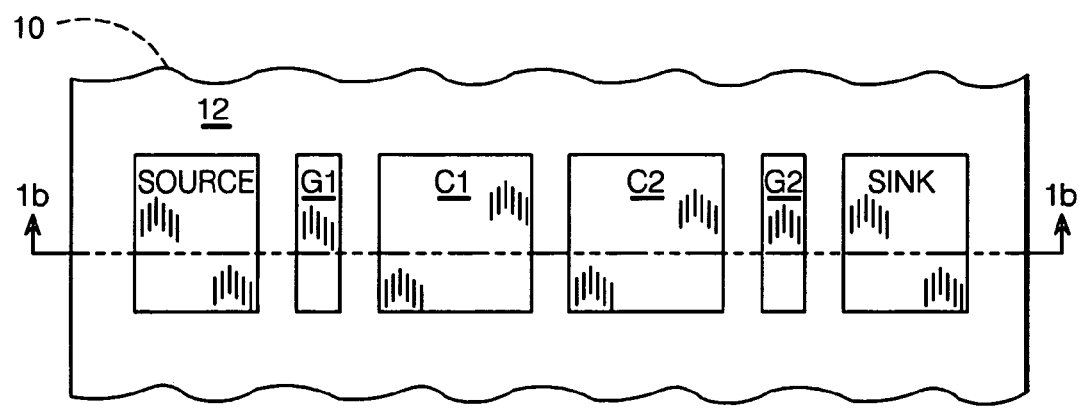
FIGS. 1a and 1b are plan and sectional views, respectively, of a variable charge packet IC capacitor per the present invention.
Figure 1B:
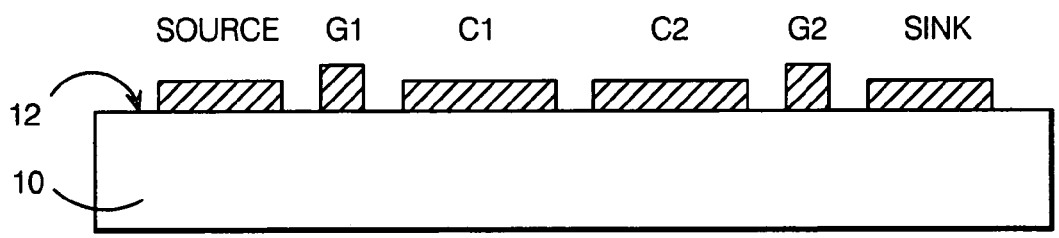

A plan view and a corresponding sectional view of a variable charge packet IC capacitor per the present invention are shown in FIGS. 1a and 1b. The device is built on a semiconductor layer 10 comprising, for example, silicon or a compound semiconductor such as gallium arsinide, which has preferably been lightly doped to provide excess mobile charge carriers. For example, if layer 10 has been doped to be an N-type layer, the available mobile charge carriers are electrons. Note that, though the exemplary embodiment described herein employs an N-type layer, a device doped such that the available mobile charge carriers are holes could also be fabricated and operated in a similar manner.

A number of electrodes are disposed on one of the surfaces 12 of layer 10. First and second capacitor electrodes C1, C2 are disposed adjacent to each other on surface 12, and first and second gate electrodes G1 and G2 are disposed on opposite sides of electrodes C1 and C2 on surface 12; the capacitor and gate electrodes are preferably Schottky barrier electrodes. Ohmic contact source and sink electrodes are disposed on opposite sides of G1 and G2 on surface 12.

To initialize the present capacitor, circuitry (not shown), which is preferably also disposed on layer 10, is coupled to the gate, source and sink electrodes. The circuitry is arranged to provide potentials to the electrodes as needed to:

- inject a finite charge into the region of layer 10 under capacitor electrodes C1 and C2, and
- apply potentials to G1 and G2 such that the injected charge is confined to the region of layer 10 under the capacitor electrodes.

With the capacitor so initialized, an RF drive signal voltage V can be applied between capacitor electrodes C1 and C2. In response to the drive signal voltage, the finite charge confined between G1 and G2, referred to herein as a "charge packet", moves back and forth between the region of layer 10 under C1 and the region of layer 10 under C2. The presence of the moving charge packet results in an effective capacitance between electrodes C1 and C2 which is much greater than the minimal passive electrostatic mutual capacitance normally present.

The resulting effective capacitance between electrodes C1 and C2 is given by C=Q/V, where Q is the magnitude of the charge packet. By properly manipulating the potentials applied to the gate, source and sink electrodes, the present invention enables the value of Q—and thus the value of C—to be controlled.

Figure 2:
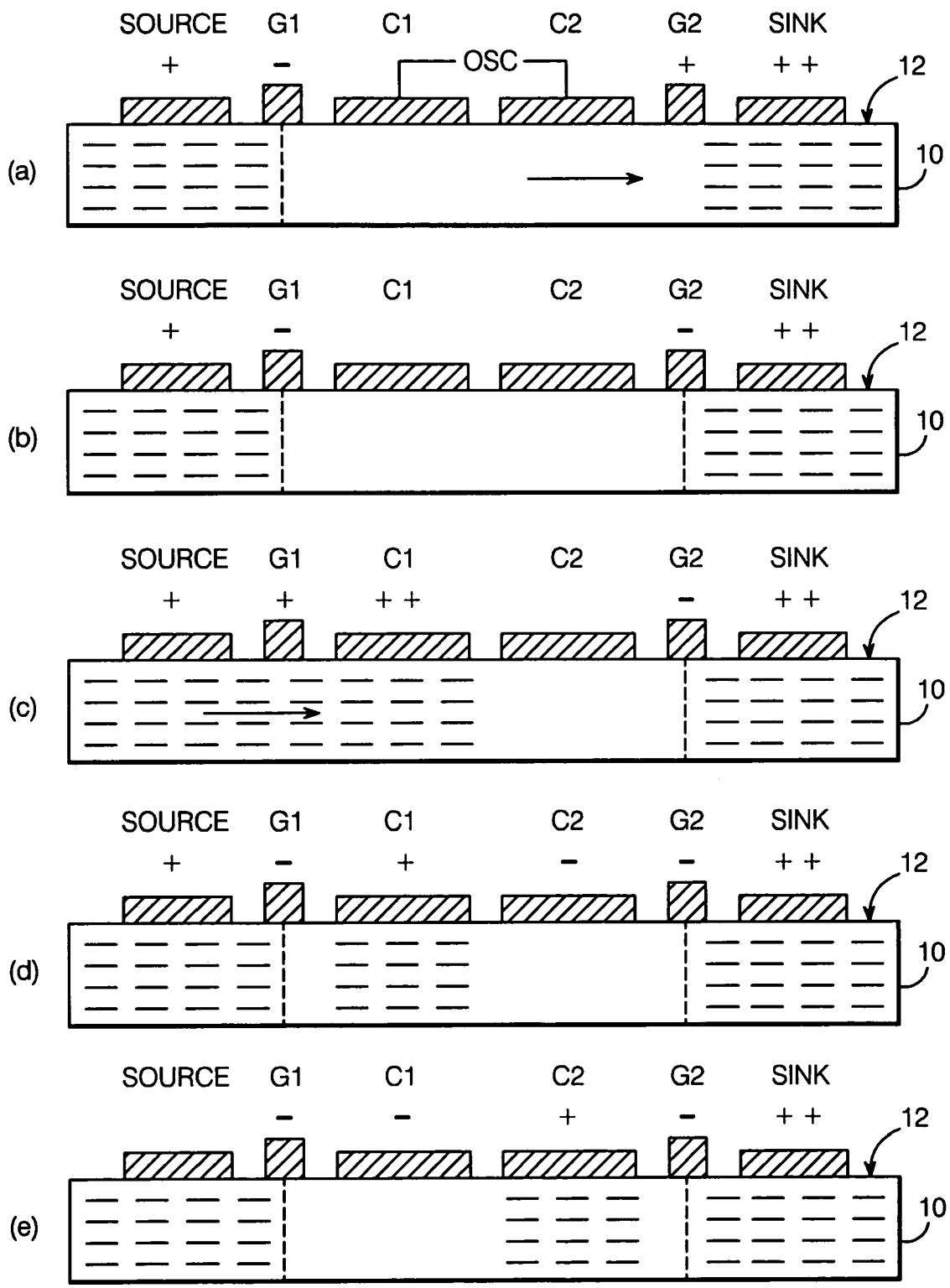
FIGS. 2a-2e are sectional views of a variable charge packet IC capacitor per the present invention illustrating the initialization and operation of the capacitor.
Figure 3:
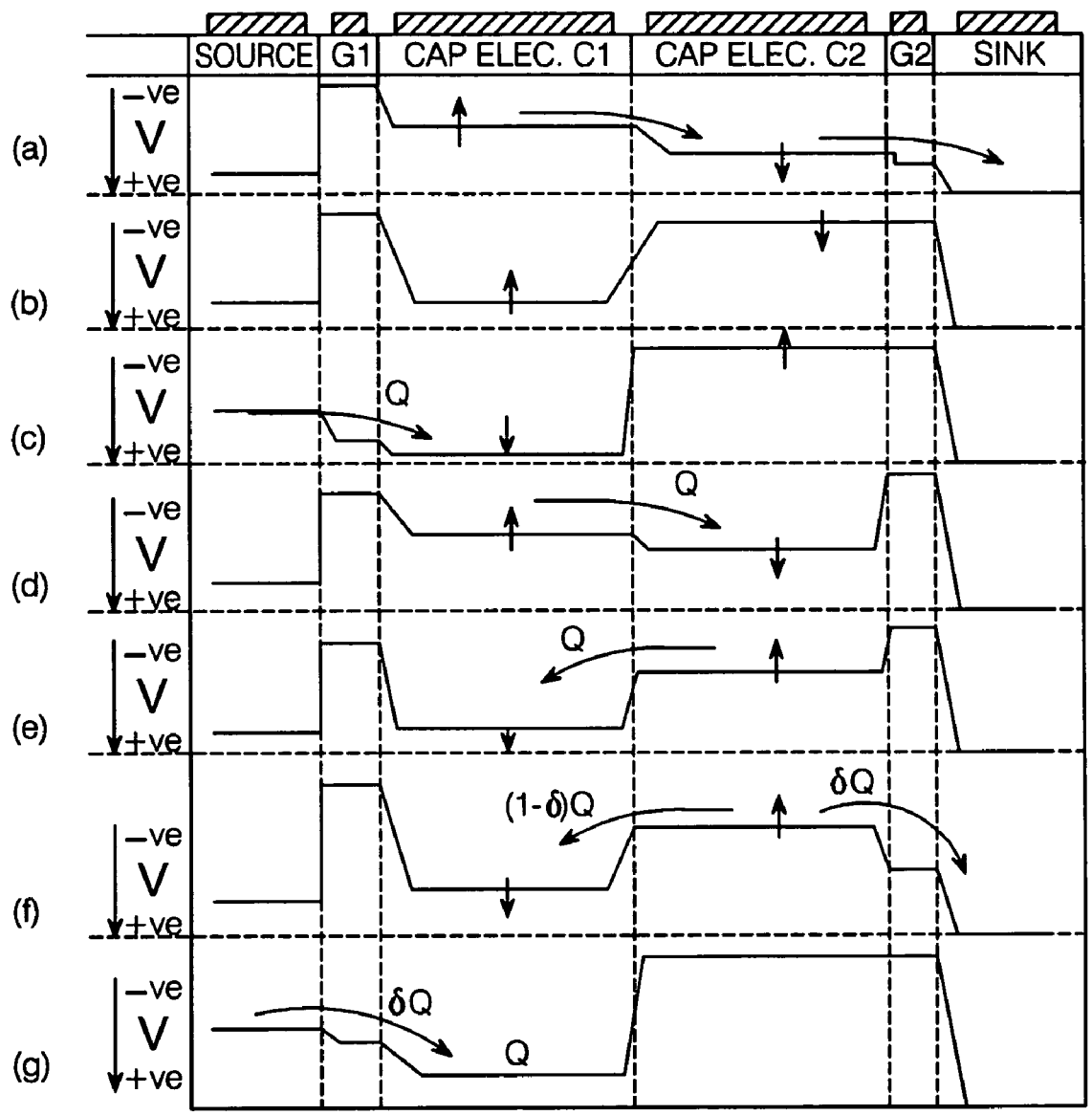
FIGS. 3a-3g are electron energy diagrams which illustrate the initialization and operation of a variable charge packet IC capacitor per the present invention.

The operation of the present variable charge packet capacitor is illustrated in FIGS. 2 and 3. FIGS. 2a-2e provide cross-sectional representations of the device in various modes of operation, and FIGS. 3a-3g provide electron energy diagrams that correspond to the operating modes shown in FIG. 2. The '+' and '−' symbols above the electrodes in FIG. 2 represent the potentials applied to the electrodes with respect to each other: i.e., '+' is positive with respect to '−', and '++' is positive with respect to '+' or '−'. These relationships can also be seen in the energy diagrams of FIG. 3; the mobile charge carriers are electrons; as electrons have a negative charge, electrons of higher energy (measured in electron-Volts) are those in locations of lower '−' potential and move, if allowed, to locations of lower energy where potential is more positive '+'. For FIG. 3, the ordinate is energy and therefore the voltage is oriented downward while higher energy (electron-Volts) is oriented upward.

Operation of the present capacitor preferably begins by initializing the device by removing all mobile charge carriers from the region of layer 10 under capacitor electrodes C1 and C2, as shown in FIGS. 2a and 3a; in FIG. 2, "−" symbols beneath the electrodes represent the presence of mobile charge carriers. By so doing, the charge in this region will be limited to that which is deliberately injected in the steps described below, thereby enabling a desired capacitance to be achieved. As noted above, respective potentials are applied to each electrode. Mobile charge carriers are removed by making the potential applied to the sink electrode the most positive, and making the potential on G2 nearly as positive as the sink. The potential on G1 is made negative, making the region below G1 largely impermeable to electrons. An oscillatory drive signal is preferably applied to C1 and C2, causing the mobile charge carriers in the region of layer 10 under C1 and C2 to be driven to the sink electrode.

When the mobile charge carriers have been removed from the region of layer 10 under C1 and C2, the potential on electrode G2 is made negative, making the region below G2 largely impermeable to electrons; this is shown in FIGS. 2b and 3b. In this state, the number of mobile charge carriers under C1 and C2, and therefore the effective capacitance present between C1 and C2, is at a minimum.

A finite charge is then injected into the region of layer 10 under capacitor electrodes C1 and C2; this is illustrated in FIGS. 2c and 3c. This is accomplished by making the region below G1 permeable to electrons, and applying a potential between the source electrode and capacitor electrode C1 such that a finite charge is injected into the region under C1. As shown in FIGS. 2c and 3c, the region below G1 is made permeable by applying a positive potential to G1. Then, when the voltage on C1 goes positive, mobile charge carriers are transferred from the region below the source electrode to the region below C1. Ideally, during charge injection, the potential on C1 is more positive than that applied to G1, and the potential on G1 is more positive than that applied to the source electrode.

The injected charge is then confined to the region of layer 10 under C1 and C2, as shown in FIGS. 2d and 3d. This is accomplished by making the potential on electrode G1 negative, making the region below G1 largely impermeable to electrons. With negative potentials applied to both G1 and G2, the injected charge is confined to the region of layer 10 under C1 and C2. The confined charge is the capacitor's charge packet, and has a magnitude Q.

Confined charge Q now moves back and forth between the portion of region 10 below C1 and the portion of region 10 below C2 in response to an RF drive signal voltage V applied between C1 and C2; this is illustrated in FIGS. 2d, 2e, 3d and 3e. The effective capacitance C seen by RF drive signal voltage V is given by:

$$C=Q/V.$$

For a constant RF drive signal voltage V, the capacitive admittance is dependent solely on the charge packet size, which may be changed over several orders of magnitude.

The magnitude of confined charge Q is given by: $Q=nq=I*T$, wherein $I*T$ is the current I that flows between the source electrode and capacitor electrode C1 over a time T. Since capacitance C varies with Q—and thus with current I and/or time T, the present invention enables the magnitude of Q—and thereby of capacitance C—to be controlled.

The magnitude of confined charge Q can be decreased or increased as needed, as shown in FIGS. 3f and 3g, respectively. To decrease Q, the potential applied to G2 is pulsed more positive so that the region below G2 is temporarily made permeable to electrons, as was done in FIG. 3a. This enables some of charge Q to be bled off to the sink electrode, thereby reducing the device's effective capacitance. Similarly, charge Q can be increased by pulsing the potential applied to G1 positive so that the region below G1 is made temporarily permeable to electrons, as was done in FIG. 3c. This serves to increase the device's effective capacitance. The amount by which charge Q is increased or decreased depends on the specific level of the positive potentials applied to G1 or G2 during the operation, and the duration of the positive pulses.

Figure 4:
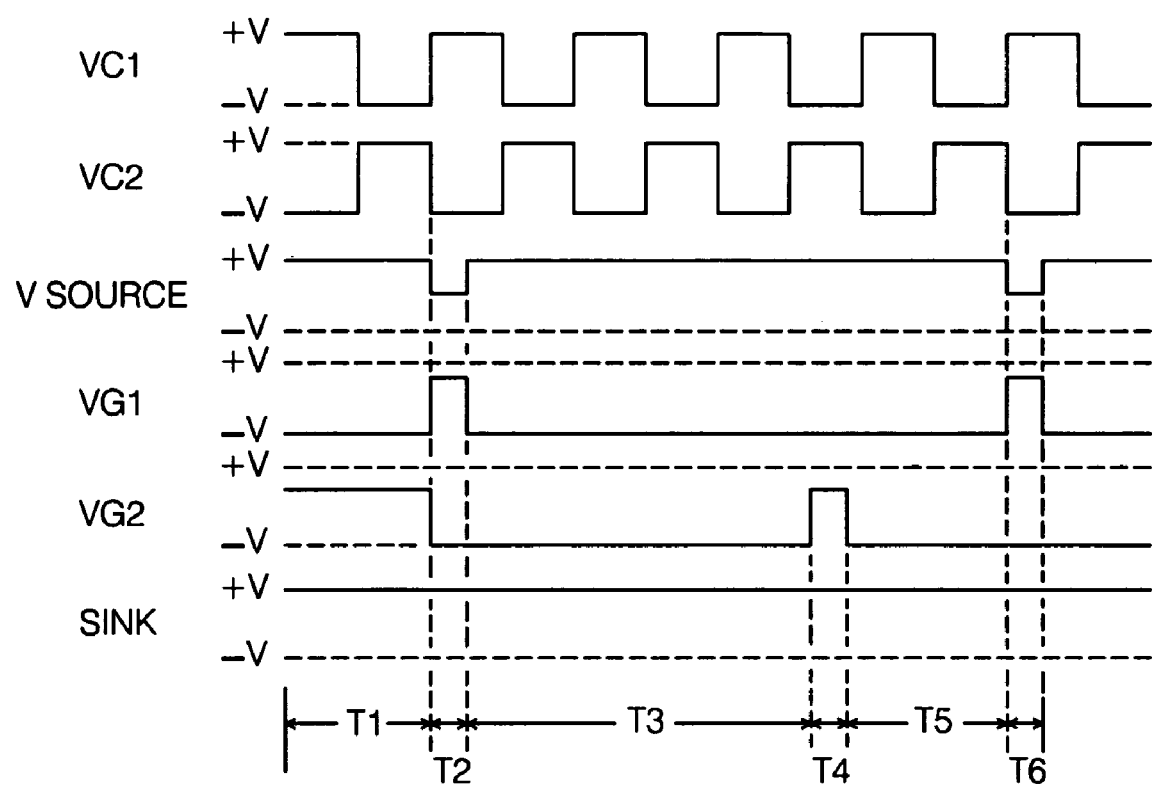
FIG. 4 is a timing diagram which depicts a sequence of potentials which could be applied to the present capacitor's various electrodes to effect the initialization and operation modes depicted in FIGS. 3a-3g.

FIG. 4 is a timing diagram which depicts the sequence of voltage potentials to be applied to the present capacitor's various electrodes to effect the initialization and operation modes depicted in FIGS. 3a-3g. VC1 and VC2 are the potentials applied to capacitor electrodes C1 and C2. During the initialization phase (T1), the potential applied to G1 (VG1) is negative, making the region below G1 impermeable to electrons, and the potential applied to G2 (VG2) is made positive to allow electrons to be driven to the even more positive sink electrode. When the mobile charge carriers have been removed from the region under C1 and C2, VG2 is made negative, rendering the region below G2 impermeable to electrons. Charge is injected during time T2 by applying positive potentials to the source, G1 and C1 electrodes, with VC1>VG1>VSOURCE, where VSOURCE is the potential applied to the source electrode.

When a sufficient charge has been injected, VG1 is made negative, making the region below G1 impermeable to electrons and thereby confining the injected charge to the region under C1 and C2. During time T3, the confined charge packet moves back and forth with VC1 and VC2 between the region below C1 and the region below C2.

As noted above in relation to FIG. 3f, the magnitude of confined charge Q can be reduced. This is also shown in FIG. 4: during time T4, VG2 is temporarily made more positive, thereby rendering the region below G2 permeable to electrons and allowing some of the confined charge to be bled to the sink electrode. When a sufficient amount of charge has been removed, VG2 is made negative again. Then, during time T5, the confined charge packet again moves back and forth with VC1 and VC2 as before, but now Q—and therefore C—is smaller (assuming that VC1 and VC2 are constant).

As noted above in relation to FIG. 3g, the magnitude of confined charge Q can also be increased. This is shown in FIG. 4 during time T6, when VG1 is temporarily made more positive, thereby rendering the region below G1 permeable to electrons and allowing some additional mobile charge carriers to be injected. When a sufficient amount of charge has been added, VG1 is made negative again.

Figure 5:
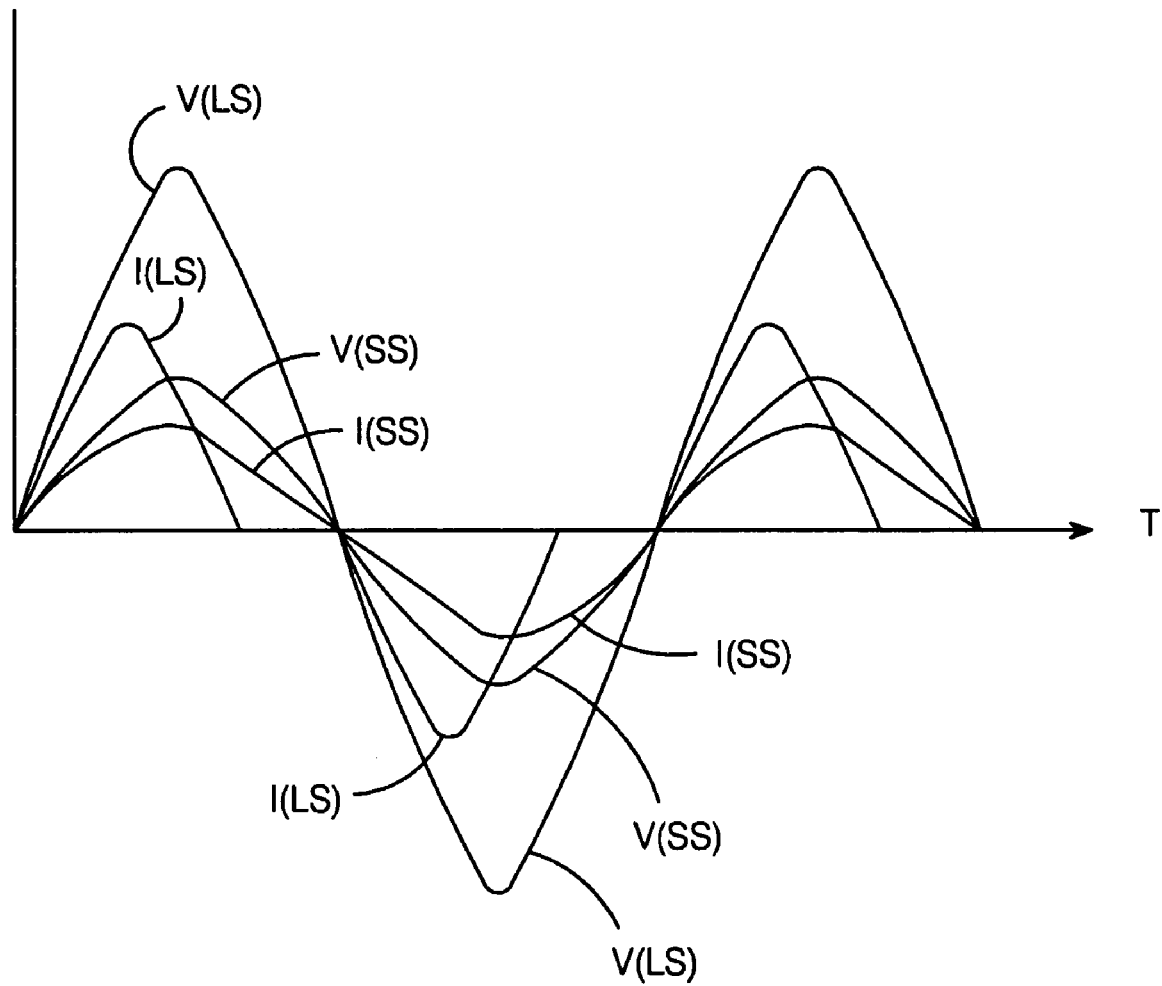
FIG. 5 is a graph showing capacitor voltage and current under small signal and large signal conditions.

Under some conditions, the current $I_{cap}$ conducted between C1 and C2 may vary non-linearly with the RF drive signal voltage V. This can occur when the magnitude of the confined charge Q is fixed, and V is sufficiently high. This is illustrated in FIG. 5. When V is small (represented with signal V(SS) in FIG. 5) and drive frequency is higher than some critical frequency Fc, the corresponding capacitor current I(SS) varies linearly with V(SS). However, for drive voltages over some threshold voltage level (represented with signal V(LS) in FIG. 5) and frequency less than Fc, the corresponding capacitor current I(LS) varies non-linearly with V(LS), because the magnitude of confined charge Q is fixed and the charge moves too swiftly to emulate linear conditions.

A means for detecting this non-linear relationship could be provided, and used for control purposes. For example, the present capacitor could be employed as part of an automatic gain control circuit, for which circuit gain is reduced when a non-linear relationship is detected by the rise of harmonic products which indicate an excessive RF drive signal voltage V. As another example, the present capacitor could be employed as part of a harmonic generator, due to the additional harmonics that arise in the capacitor's frequency response when capacitor current varies non-linearly with drive voltage.

The capacitor could also be arranged such that the magnitude of finite charge Q is made variable such that $I_{cap}$ varies linearly for a fixed RF drive signal voltage V. A means for detecting the linear relationship between $I_{cap}$ and V could be employed, which acts to inject additional charge under C1 and C2 when needed to maintain linearity.

The present variable capacitor can have an effective capacitance which may be varied over several orders of magnitude. The device's capacitance is based on Q, which varies with the number of confined mobile charge carriers. There could be as few as ~$10^3$ mobile charge carriers under a typical capacitor electrode having an area of about 100 μm×5 μm, or as many as ~$10^7$. Thus, for this example, the effective capacitance C between C1 and C2 can be varied over four orders of magnitude.

Note that the preferred structure for the present capacitor is symmetric; as such, the labeling of the electrodes of 'first' and 'second' (G1, C1, etc.) could just as well be done from right to left as they are now left to right.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A variable charge packet integrated circuit capacitor, comprising:
    a semiconductor layer doped to contain mobile charge carriers of a first polarity;
    first and second capacitor electrodes disposed adjacent to each other on a surface of said layer;
    first and second gate electrodes disposed on opposite sides of said capacitor electrodes on said surface;
    source and sink electrodes disposed on opposite sides of said gate electrodes on said surface; and
    circuitry coupled to said gate, source and sink electrodes arranged to:
        inject a finite charge into the region of said layer under said capacitor electrodes, and
        apply potentials to said gate electrodes such that said injected charge is confined to the region of said layer under said capacitor electrodes;
    such that an RF drive signal voltage V applied between said capacitor electrodes causes said confined charge to move back and forth between the portion of said region below said first capacitor electrode and the portion of said region below said second capacitor electrode.

2. The capacitor of claim 1, wherein said mobile charge carriers are electrons.

3. The capacitor of claim 1, wherein said semiconductor layer comprises a compound semi-conductor.

4. The capacitor of claim 3, wherein said semiconductor layer comprises gallium arsenide.

5. The capacitor of claim 1, wherein said semiconductor layer comprises silicon.

6. The variable capacitor of claim 1, wherein said circuitry is further arranged to remove all mobile charge carriers from the region of said layer under said capacitor electrodes prior to injecting said finite charge.

7. The capacitor of claim 1, wherein said electrodes are arranged on said surface in the following order: source, first gate, first capacitor, second capacitor, second gate, sink;
    said circuitry is further arranged to:
        apply a potential to said second gate electrode such that the area of said layer beneath said second gate electrode is made impermeable to said mobile charge carriers;
        apply a potential to said first gate electrode such that the area of said layer beneath said first gate electrode is made permeable to said mobile charge carriers;
        apply a potential between said source and first capacitor electrode such that said finite charge is injected into the region under said first capacitor electrode while the area of said layer beneath said first gate electrode is permeable; and
        apply a potential to said first gate electrode such that the area of said layer beneath said first gate electrode is made impermeable to said mobile charge carriers after said finite charge is injected, thereby confining said finite charge to the region of said layer under said capacitor electrodes.

8. The capacitor of claim 7, wherein said circuitry is further arranged such that the potentials applied to said first gate electrode and between said source and first capacitor electrodes inject a finite charge Q into the region of said layer under said capacitor electrodes, wherein Q is given by:

$$Q=nq=I*T,$$

wherein I*T is the current I that flows between said source electrode and said first capacitor electrode over a time T, said capacitor having an effective capacitance C given by Q/V, such that finite charge Q and thereby capacitance C varies with said current I and/or said time T.

9. The capacitor of claim 1, wherein the magnitude of said finite charge is fixed such that the current $I_{cap}$ conducted between said capacitor electrodes varies non-linearly with varying levels of RF drive signal voltage V.

10. The capacitor of claim 9, further comprising a means for detecting said non-linear variation of current $I_{cap}$.

11. The capacitor of claim 1, wherein the magnitude of said finite charge is variable such that the current $I_{cap}$ conducted between said capacitor electrodes varies linearly for a fixed RF drive signal voltage V.

12. The capacitor of claim 11, further comprising a means for detecting said linear variation of current $I_{cap}$.

13. The capacitor of claim 1, wherein said capacitor and gate electrodes are Schottky barrier electrodes and said source and sink electrodes are ohmic contact electrodes.

14. A variable charge packet integrated circuit capacitor, comprising:
a semiconductor layer doped to contain mobile charge carriers of a first polarity;
first and second capacitor Schottky barrier electrodes disposed adjacent to each other on a surface of said layer;
first and second gate Schottky barrier electrodes disposed on opposite sides of said capacitor electrodes on said surface;
source and sink ohmic contact electrodes disposed on opposite sides of said gate electrodes on said surface, such that said electrodes are arranged on said surface in the following order: source, first gate, first capacitor, second capacitor, second gate, sink; and
circuitry coupled to said gate, source and sink electrodes arranged to:
remove all mobile charge carriers from the region of said layer under said capacitor electrodes;
apply a potential to said second gate electrode such that the area of said layer beneath said second gate electrode is made impermeable to said mobile charge carriers;
apply a potential to said first gate electrode such that the area of said layer beneath said first gate electrode is made permeable to said mobile charge carriers;
apply a potential between said source and first capacitor electrode such that said finite charge is injected into the region under said first capacitor electrode while the area of said layer beneath said first gate electrode is permeable; and
apply a potential to said first gate electrode such that the area of said layer beneath said first gate electrode is made impermeable to said mobile charge carriers after said finite charge is injected, thereby confining said finite charge to the region of said layer under said capacitor electrodes;
such that an RF drive signal applied between said capacitor electrodes causes said confined charge to move back and forth between the portion of said region below said first capacitor electrode and the portion of said region below said second capacitor electrode.

15. The capacitor of claim 14, wherein said semiconductor layer is an N-type layer and said mobile charge carriers are electrons.

16. A method of providing an integrated circuit (IC) variable capacitor, comprising:
providing a layer of a semiconductor material;
injecting a finite charge into a region of said layer;
confining said finite charge within said region; and
applying an RF drive signal voltage to first and second capacitor electrodes disposed adjacent to each other on a surface of said layer and above said region such said voltage causes said confined charge to move back and forth between the portion of said region below said first capacitor electrode and the portion of said region below said second capacitor electrode.

17. The method of claim 16, further comprising removing all mobile charge carriers from said region prior to injecting said finite charge.

18. The method of claim 16, wherein said injection of said finite charge comprises:
providing first and second gate electrodes disposed on opposite sides of said capacitor electrodes on said surface;
providing source and sink electrodes disposed on opposite sides of said gate electrodes on said surface, such that said electrodes are arranged on said surface in the following order: source, first gate, first capacitor, second capacitor, second gate, sink;
applying a potential to said second gate electrode such that the area of said layer beneath said second gate electrode is made impermeable to the mobile charge carriers making up said finite charge;
applying a potential to said first gate electrode such that the area of said layer beneath said first gate electrode is made permeable to said mobile charge carriers; and
applying a potential between said source electrode and said first capacitor electrode such that said finite charge is injected into the region under said first capacitor electrode while the area of said layer beneath said first gate electrode is permeable; and
applying a potential to said first gate electrode such that the area of said layer beneath said first gate electrode is made impermeable to said mobile charge carriers after said finite charge is injected, thereby confining said finite charge to the region of said layer under said capacitor electrodes.

19. The method of claim 18, further comprising applying a potential to said second gate electrode such that the area of said layer beneath said second gate electrode is made permeable to said mobile charge carriers such that the magnitude of said finite charge is reduced.

20. The method of claim 18, further comprising:
applying a potential to said first gate electrode such that the area of said layer beneath said first gate electrode is made permeable to said mobile charge carriers; and
applying a potential between said source electrode and said first capacitor electrode such that additional charge is injected into the region under said first capacitor electrode while the area of said layer beneath said first gate electrode is permeable, such that the magnitude of said finite charge is increased.

* * * * *